(12) United States Patent
Oyamada

(10) Patent No.: US 8,089,005 B2
(45) Date of Patent: Jan. 3, 2012

(54) WIRING STRUCTURE OF A SUBSTRATE

(75) Inventor: Seisei Oyamada, Tokyo (JP)

(73) Assignee: Liquid Design Systems Inc., Yokohama, Kanagawa (JP)

( * ) Notice: Subject to any disclaimer, the term of this patent is extended or adjusted under 35 U.S.C. 154(b) by 961 days.

(21) Appl. No.: 12/077,175

(22) Filed: Mar. 17, 2008

(65) Prior Publication Data

US 2009/0229866 A1 Sep. 17, 2009

(51) Int. Cl.
*H05K 1/11* (2006.01)
(52) U.S. Cl. ......................................................... 174/261
(58) Field of Classification Search .................... 174/261
See application file for complete search history.

(56) References Cited

U.S. PATENT DOCUMENTS 5,847,936 A * 12/1998 Forehand et al. ............. 361/794
6,969,808 B2 * 11/2005 Shiraki ........................... 174/255
2007/0124930 A1 * 6/2007 Cheng et al. .................... 29/852

FOREIGN PATENT DOCUMENTS

JP 2002-344149 11/2002

* cited by examiner

*Primary Examiner* — Chau Nguyen
(74) *Attorney, Agent, or Firm* — Collard & Roe, P.C.

(57) ABSTRACT

A wiring structure of a substrate adapted to mount a plurality of integrated circuits has a signal wire for connecting the integrated circuits to each other, first and second power supply layers faced to each other, and return path wires arranged generally in parallel to the signal wire. One of the return path wires has opposite terminal ends connected to the first power supply layer (Vcc layer). The other return path wire has opposite terminal ends connected to the second power supply layer (GND layer).

7 Claims, 6 Drawing Sheets

WIRING STRUCTURE OF A SUBSTRATE

BACKGROUND OF THE INVENTION

This invention relates to a wiring structure of a substrate and, in particular, to a wiring structure of a substrate, which is capable of assuring a transmission quality of a high-frequency (high-speed) signal.

In a wiring board for transmitting a high-frequency signal, various proposals for improvement in characteristic impedance and EMI (Electro-Magnetic Interference) protection have been made in order to secure a transmission quality of the high-frequency signal (for example, see Japanese Unexamined Patent Application Publication (JP-A) No. 2002-344149).

Referring to FIG. 1, an organic substrate adapted to mount an integrated circuit is a built-up substrate having a multi-layer structure. The organic substrate comprises a plurality of first signal wires 501 and a plurality of second signal wires 502. Between the first and the second signal wires 501 and 502, a first insulating layer 503, a first power supply layer (GND layer) 504, a second insulating layer 505, a second power supply layer (Vcc layer) 506, and a third insulating layer 507 are successively laminated.

In the built-up substrate illustrated in FIG. 1, the signal wires are arranged in parallel to the power supply layer via the insulating layer. With this structure, the signal wire is assured to have a continuous characteristic impedance so that a transmission quality is secured when a high-frequency signal is transmitted.

In the above-mentioned built-up substrate, a sink current, a source current, and a through current required upon switching a transistor present in a semiconductor circuit can be secured by a parasitic capacitance formed by the first and the second power supply layers 504 and 505 and the second insulating layer 505 formed between the first and the second power supply layers 504 and 505 or by an external bypass capacitor.

In the above-mentioned built-up substrate, a return current of a high-frequency current on the signal wire 501 flows to the second power supply layer 506 while a return current of a high-frequency current on the signal wire 502 flows to the first power supply layer 504. Therefore, it is possible to secure a return path of the return current.

However, a semiconductor substrate reduced in size and profile and a single-layer or a double-layer organic substrate can not have a multi-layer structure and are therefore disadvantageous as will be described hereinafter.

Referring to FIG. 2, a single-layer organic substrate has a plurality of first signal wires 601, an insulating layer 602, and a plurality of second signal wires 603. In case of such a substrate which can not have a multi-layer structure, there are following problems:

(1) It is difficult to secure continuity of a characteristic impedance of the signal wire.

(2) It is difficult to secure a return path of a return current.

(3) It is difficult to achieve a low impedance of a power supply line.

Thus, it is difficult to secure a transmission quality of a high-frequency signal.

SUMMARY OF THE INVENTION

In view of the above, it is an object of this invention to provide a wiring structure of a substrate without a multi-layer structure, which is capable of assuring a transmission quality of a high-frequency signal.

According to this invention, there is provided a wiring structure of a substrate adapted to mount a plurality of integrated circuits. The wiring structure comprises a signal wire for connecting the integrated circuits to each other, first and second power supply layers faced to each other, and a return path wire arranged generally in parallel to the signal wire. The return path wire has opposite terminal ends connected to at least one of the first and the second power supply layers. The signal wire, the return path wire, and an insulating film sandwiched between the signal wire and the return path form a primary capacitance. The first power supply layer, the second power supply layer, and the insulating film sandwiched between the first and the second power supply layers form a secondary capacitance.

Preferably, a pair of return path wires are arranged with the signal wire interposed therebetween. One of the return path wires has opposite terminal ends connected to the first power supply layer and the other return path wire has opposite terminal ends connected to the second power supply layer.

Preferably, the first power supply layer is a Vcc layer while the second power supply layer is a GND layer.

Preferably, the signal wire is a signal wire for a high-frequency signal.

Preferably, the substrate has a single layer structure.

Preferably, the substrate is an organic substrate, a semiconductor substrate, or a ceramic substrate.

According to this invention, there is provided a wiring structure of a substrate adapted to mount a plurality of integrated circuits. The wiring structure comprises a signal wire for connecting the integrated circuits to each other, first and second power supply layers faced to each other, and a return path wire arranged generally in parallel to the signal wire. The return path wire has opposite terminal ends connected to at least one of the first and the second power supply layers. The signal wire, the return path wire, and an insulating film sandwiched between the signal wire and the return path form a primary capacitance. The first power supply layer, the second power supply layer, and the insulating film sandwiched between the first and the second power supply layers form a secondary capacitance. Therefore, in a wiring structure of a substrate without a multi-layer structure, it is possible to secure a transmission quality of a high-frequency signal.

DESCRIPTION OF THE EXEMPLARY EMBODIMENT

Figure 1:
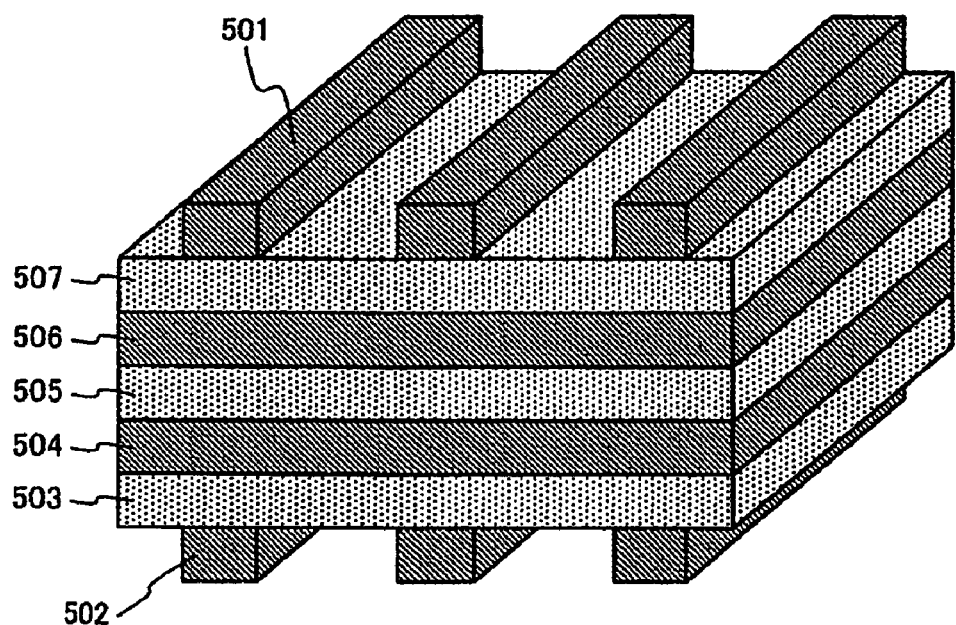
FIG. 1 is a partially sectional perspective view showing an organic substrate having a multi-layer structure.
Figure 2:
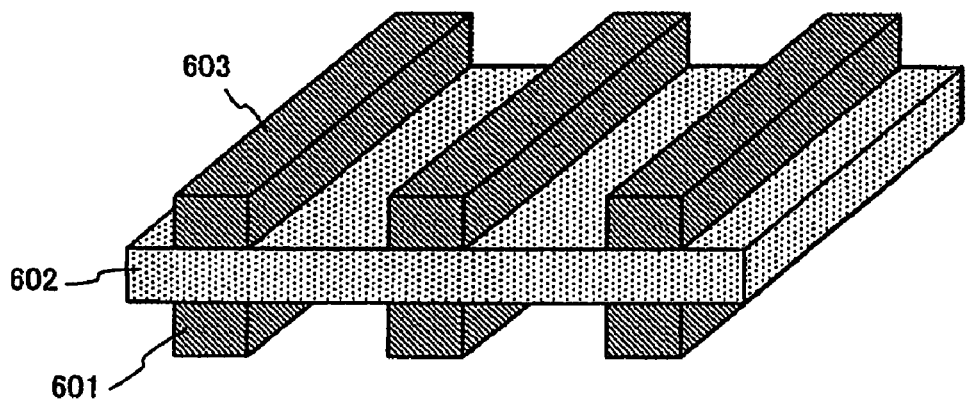
FIG. 2 is a partially sectional perspective view showing an organic substrate having a single-layer structure.

Now, an exemplary embodiment of this invention will be described with reference to the drawing. It is noted here that this invention is not limited to the following embodiments. Components in the following embodiment encompass those which are readily envisaged by a skilled person or those which are substantially equivalent.

Embodiment

Referring to FIGS. 3A to 3E, a wiring structure of a substrate according to an embodiment of this invention will be described. The substrate in the embodiment is applicable to the case where various kinds of integrated circuits are mounted. For example, the integrated circuits may be a memory, a microprocessor, and a DSP (Digital Signal Processor).

Referring to FIGS. 3A to 3E, the wiring structure according to the embodiment is depicted by 100. A substrate 101 illustrated in the figures may be, for example, a semiconductor substrate of silicon of a double-layer structure. Not being limited to the semiconductor silicon substrate, this invention is applicable to an organic substrate or a ceramic substrate provided with an insulating film. IC chips 110 and 120 are mounted to the substrate 101. The IC chip 110 has a plurality of pads 111a, 111b, and 111c for wire bonding. The IC chip 120 has a plurality of pads 121a, 121b, and 121c for solder balls.

In the illustrated example, the substrate 101 is covered with an insulating film 102. On the substrate 101, a first power supply layer (Vcc layer) 130 and a second power supply layer (GND layer) 140 are disposed to face each other with the insulating film 102 interposed therebetween.

Figure 3A:
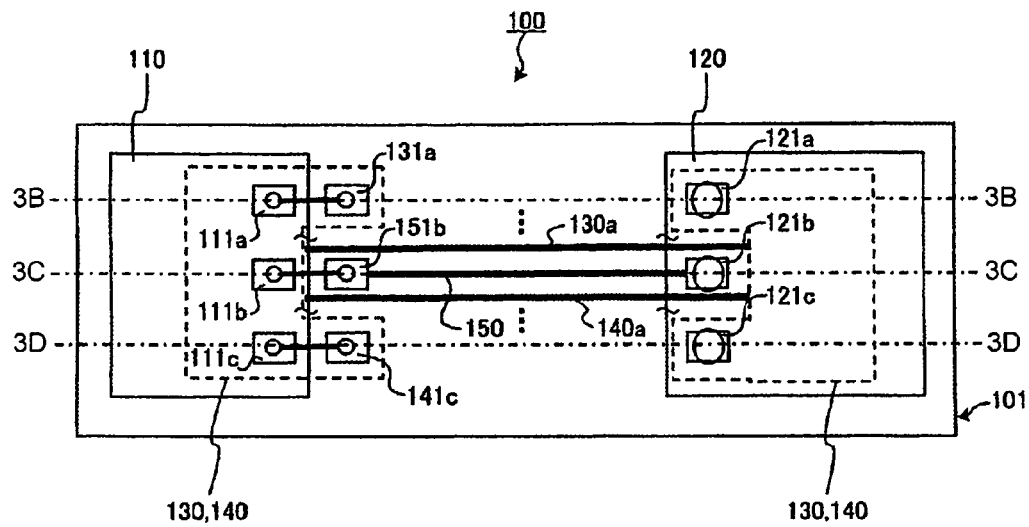
FIG. 3A is a schematic view for describing a wiring structure of a substrate according to an embodiment of this invention.
Figure 3B:
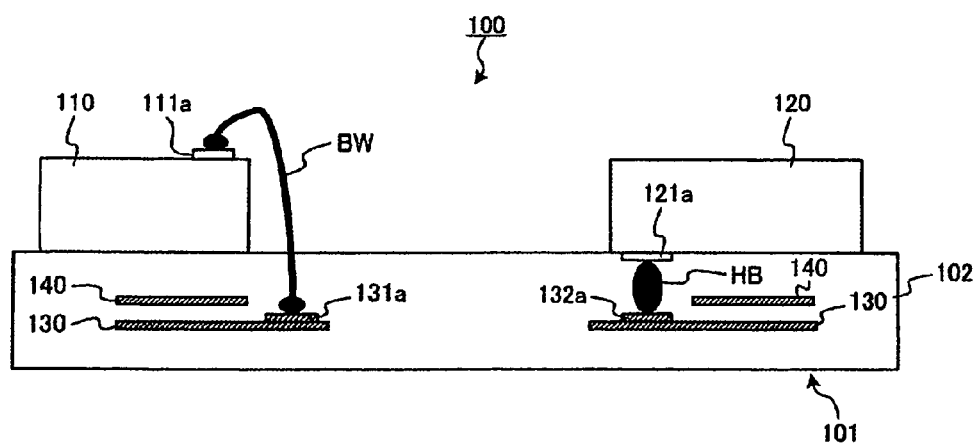
FIG. 3B is a sectional view taken along a line 3B-3B in FIG. 3A.
Figure 3C:
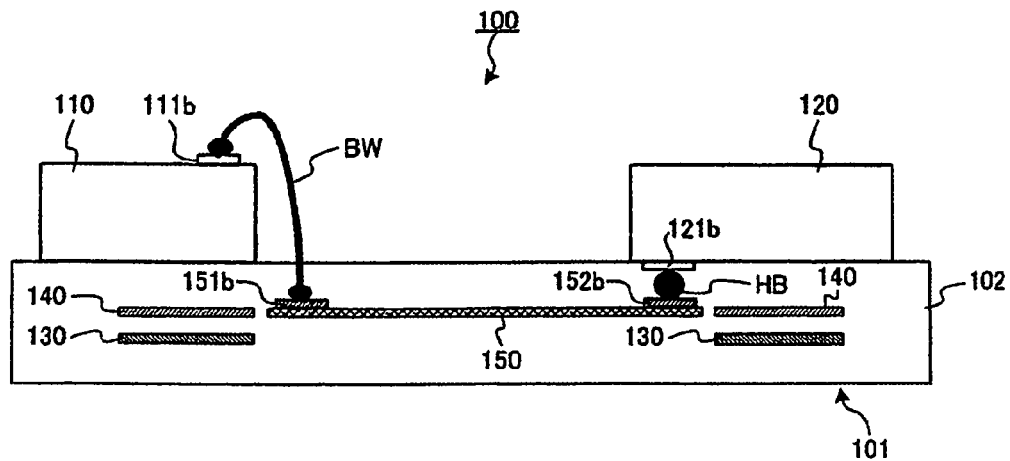
FIG. 3C is a sectional view taken along a line 3C-3C in FIG. 3A.
Figure 3D:
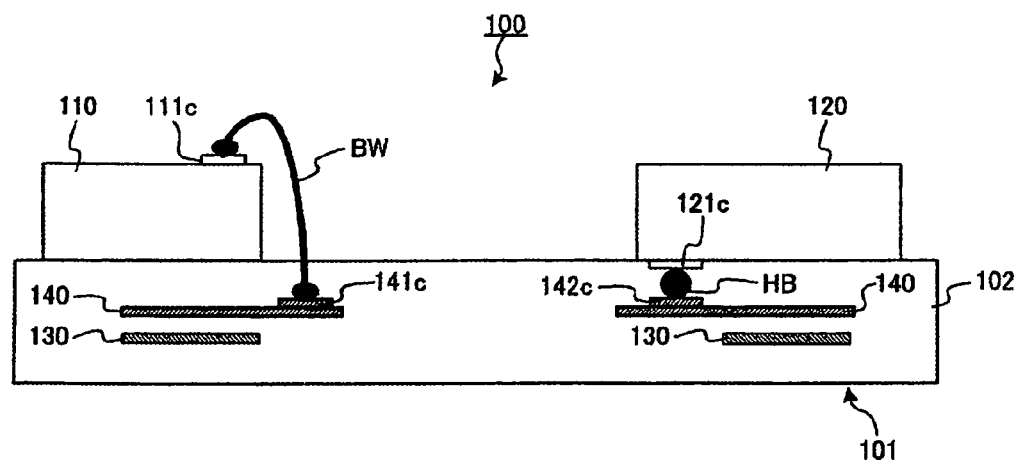
FIG. 3D is a sectional view taken along a line 3D-3D in FIG. 3A.

As simply illustrated in FIG. 3A, the pads 111a and 111c of the IC chip 110 are connected to a pad 131a of the first power supply layer 130 formed on the substrate 101 and a pad 141c of the second power supply layer 140 by bonding wires BW through the insulating film 102, respectively. As shown in FIGS. 3A, 3B, and 3D, the pads 121a and 121c of the IC chip 120 are connected to a pad 132a of the first power supply layer 130 and a pad 142c of the second power supply layer 140 by solder balls HB, respectively.

Referring to FIGS. 3A to 3E, a plurality of signal wires 150 are laid between the IC chips 110 and 120 to be substantially flush with the second power supply layer 140. The signal wires 150 serve to transmit high-frequency signals between the IC chips 110 and 120. Each of the signal wires 150 has opposite ends formed at positions sandwiched between the first and the second power supply layers 130 and 140. On the opposite ends of the signal wire 150, a pad 151b for wire bonding and a pad 152b for a solder ball are formed, respectively. The pad 111b of the IC chip 110 is connected to the pad 151b of the signal wire 150 by a bonding wire BW. The pad 121b of the IC chip 120 is connected to the pad 152b of the signal wire 150 by a solder ball HB.

Figure 3E:
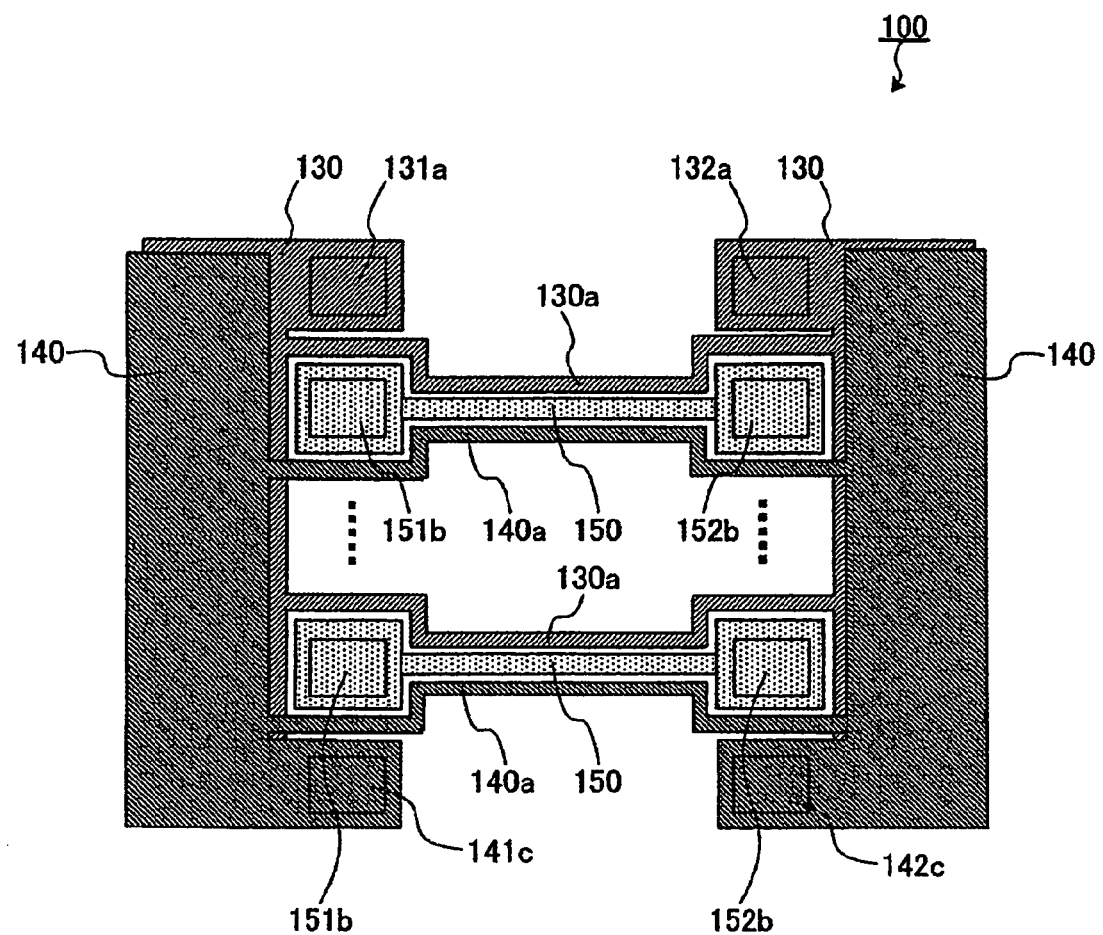
FIG. 3E is a schematic plan view showing a first power supply layer, a second power supply layer, signal wires, and return-path wires in the wiring structure illustrated in FIG. 3A.

As illustrated in FIG. 3E, in order to secure a continuous characteristic impedance of each signal wire 150, a pair of return path wires 130a and 140a are formed with the signal wire 150 interposed therebetween and extend generally in parallel to (at substantially equal intervals from) the signal wire 150. The return path wire 130a has opposite terminal ends connected to the first power supply layer 130. The return path wire 140a has opposite terminal ends connected to the second power supply layer 140. Thus, the illustrated signal wire 150 is arranged between the return path wires 130a and 140a on the same plane. Thus, the illustrated structure is effective to provide the characteristic impedance.

Figure 4:
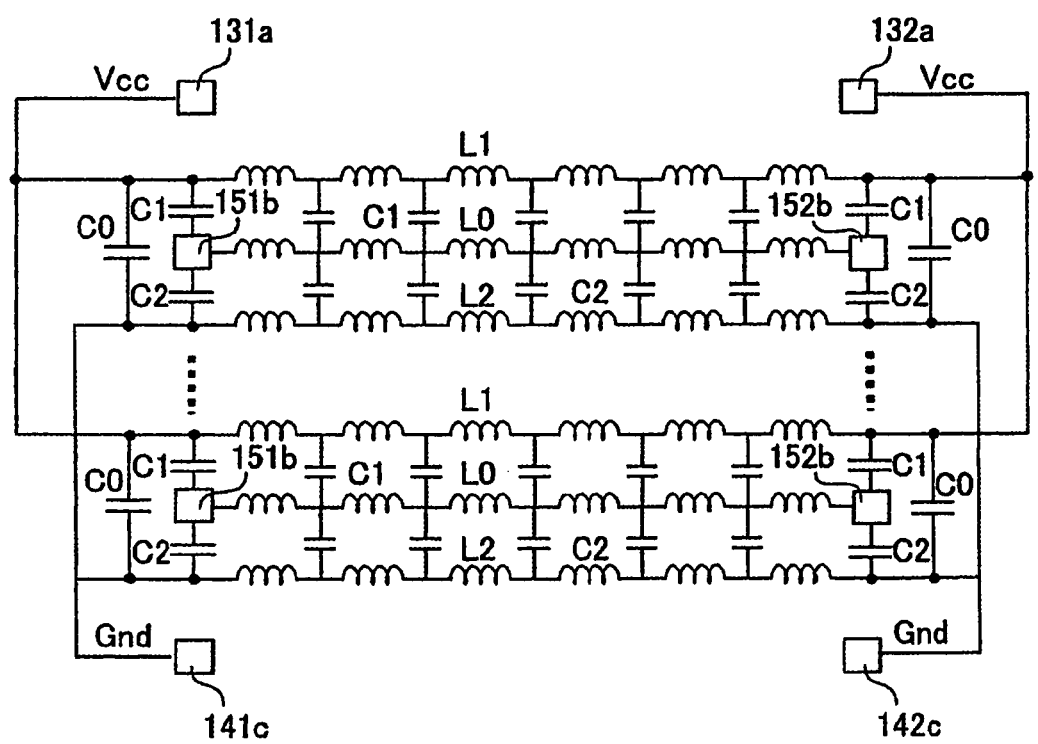
FIG. 4 is a view showing an equivalent circuit of the wiring structure illustrated in FIG. 3E.

Referring to FIG. 4, an equivalent circuit of the wiring structure illustrated in FIG. 3E will be described. In the figure, a parasitic capacitance (secondary capacitance) C0 is formed by the first power supply layer (Vcc layer) 130, the second power supply layer (GND layer) 140, and the insulating film 102 sandwiched between the first and the second power supply layers 130 and 140. A capacitance (primary capacitance) C1 is formed by the signal wire 150, the return path wire 130a, and the insulating film 102 sandwiched between the signal wire 150 and the return path wire 130a. A capacitance C2 (primary capacitance) is formed by the signal wire 150, the return path wire 140a, and the insulating film 102 sandwiched between the signal wire 150 and the return path wire 140a. L0, L1, and L2 represent an impedance component of the signal wire 150, an impedance component of the return path wire 130a, and an impedance component of the return path wire 140a, respectively.

As illustrated in FIG. 4, the signal wire 150 closed by the pads 151b and 152b is assured to have continuity of the characteristic impedance by the capacitances C1 and C2 formed by the return path wires 130a and 140a arranged at equal distances from the signal wire 150 with the insulating film 102 interposed therebetween. Between the first and the second power supply layers 130 and 140 having a large area, a large parasitic capacitance C0 is formed. Therefore, a low impedance is kept between the first and the second power supply layers 130 and 140. Thus, at the opposite terminal ends of the return path wires 130a and 140a also, continuity of the characteristic impedance is secured. Transistors mounted to the IC chips 110 and 120 are supplied from the first and the second power supply layers 130 and 140 with a low-impedance power supply over an operation range from a low-frequency operation to a high-frequency operation. Therefore, it is possible to prevent power supply noise caused by a source-drain current at the time instant when an input signal is turned from a low level to a high level.

Thus, an area closed by the pads 131a, 132a, 141c, and 142c (a loop formed by the first power supply layer 130, the second power supply layer 140, the signal wire 150, and the return path wires 130a and 140a) forms a low-impedance closed loop. Therefore, flows of a sink current and a source current and a return path of a return current of a high-frequency current flowing through the signal wire 150 are formed on the closed loop. It is therefore possible to prevent occurrence of EMI generated from power supply noise or the return current as a radiation source.

According to the foregoing embodiment, the wiring structure of a substrate adapted to mount a plurality of integrated circuits has the signal wire 150 for connecting the integrated circuits to each other, the first and the second power supply layers 130 and 140 faced to each other, and the return path wires 130a and 140a arranged generally in parallel to the signal wire 150. The opposite terminal ends of the return path wire 130a are connected to the first power supply layer (Vcc layer) 130. The opposite terminal ends of the return path wire 140a are connected to the second power supply layer (GND layer) 140. The capacitance C1 (primary capacitance) is formed by the signal wire 150, the return path wire 130a, and the insulating film 102 sandwiched between the signal wire 150 and the return path wire 130a. The capacitance C2 (primary capacitance) is formed by the signal wire 150, the return path wire 140a, and the insulating film 102 sandwiched between the signal wire 150 and the return path wire 140a. The parasitic capacitance C0 (secondary capacitance) is formed by the first power supply layer 130, the second power supply layer 140, and the insulating film 102 sandwiched between the first and the second power supply layers 130 and 140. Therefore, a low-impedance narrow loop can be formed by the first power supply layer 130, the second power supply layer 140, the signal wire 150, and the return path wires 130a and 140a. It is possible to secure continuity of the characteristic impedance of the signal wire, to secure a return path of the return current, and to prevent occurrence of power supply noise. Thus, in the wiring structure of a substrate without a multi-layer structure, it is possible to secure a transmission quality of a high-frequency signal.

Modifications

Figure 5A:
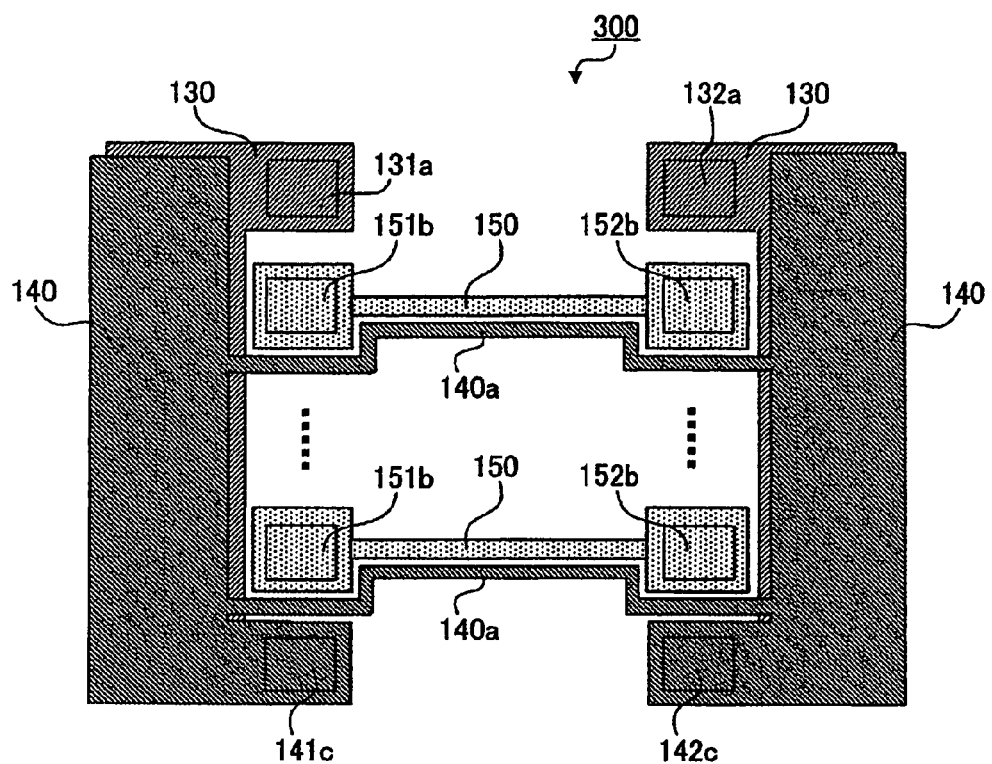
FIG. 5A is a schematic view for describing a first modification of the wiring structure.
Figure 5B:
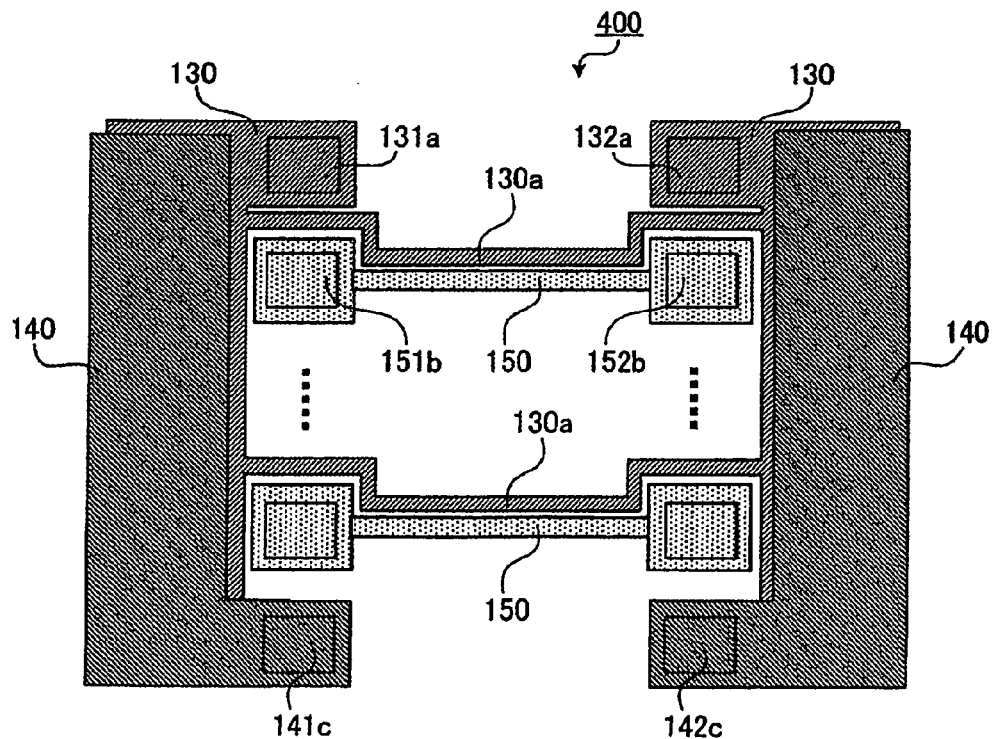
FIG. 5B is a schematic view for describing a second modification of the wiring structure.

Referring to FIGS. 5A and 5B, modifications of the wiring structure of a substrate will be described. In the foregoing embodiment, a pair of return path wires 130a and 140a are arranged with respect to the signal wire 150 to be generally in parallel thereto. However, a plurality of return path wires are not necessarily required for each signal wire 150 but the similar effect is obtained by a single return path wire. In the modifications of the wiring structure, a single return path wire is arranged with respect to each signal wire 150.

Referring to FIG. 5A, a first modification of the wiring structure will be described. In FIG. 5A, parts equivalent in function to those in FIG. 3E are designated by like reference numerals. In a wiring structure 300 as the first modification, the return path wire 140a alone is arranged generally in parallel to the signal wire 150, as illustrated in FIG. 5A. The opposite terminal ends of the return path wire 140a are connected to the second power supply layer (GND layer) 140.

Referring to FIG. 5B, a second modification of the wiring structure will be described. In FIG. 5B, parts equivalent in function to those in FIG. 3E are designated by like reference numerals. In a wiring structure 400 as the second modification, the return path wire 130a alone is arranged generally in parallel to the signal wire 150, as illustrated in FIG. 5B. The opposite ends of the return path wire 130a are connected to the first power supply layer (Vcc layer) 130.

In the wiring structure according to the modifications, one return path wire 130a or 140a is arranged with respect to each signal wire 150. Therefore, a wiring space can be reduced and the degree of freedom in layout of the substrate is improved.

The wiring structure of a substrate according to this invention is particularly effective when it is used as a transmission path of a high-frequency signal.

Although this invention has been described in conjunction with the exemplary embodiment thereof, this invention is not limited to the foregoing embodiment but may be modified in various other manners within the scope of the appended claims.

What is claimed is:

1. A wiring structure of a substrate adapted to mount a plurality of integrated circuits, the wiring structure comprising:
   a signal wire for connecting the integrated circuits to each other;
   first and second power supply layers faced to each other; and
   a return path wire arranged generally in parallel to the signal wire;
   wherein:
   the signal wire, the first and the second power supply layers, and the return path wire are flush with one another on a plane;
   wherein:
   the return path wire has opposite terminal ends connected to at least one of the first and the second power supply layers;
   the signal wire, the return path wire, and an insulating film sandwiched between the signal wire and the return path wire form a primary capacitance on the same plane; and
   wherein:
   the first power supply layer, the second power supply layer, and the insulating film sandwiched between the first and the second power supply layers form a secondary capacitance.

2. The wiring structure according to claim 1, wherein:
   a pair of return path wires are arranged with the signal wire interposed therebetween on the plane;
   one of the return path wires having opposite terminal ends connected to the first power supply layer, the other return path wire having opposite terminal ends connected to the second power supply layer.

3. The wiring structure according to claim 1, wherein the first power supply layer is a Vcc layer while the second power supply layer is a GND layer.

4. The wiring structure according to claim 1, wherein the signal wire is a signal wire for a high-frequency signal.

5. The wiring structure according to claim 1, wherein the substrate has a single layer structure.

6. The wiring structure according to claim 1, wherein the substrate is an organic substrate, a semiconductor substrate, or a ceramic substrate.

7. The wiring structure according to claim 1, wherein the signal wire and the return path wire are connected to the integrated circuits through bumps.

* * * * *